US 9,838,026 B2

(12) United States Patent
Van Brunt et al.

(10) Patent No.: US 9,838,026 B2
(45) Date of Patent: Dec. 5, 2017

(54) APPARATUS AND METHODS FOR FRACTIONAL-N PHASE-LOCKED LOOPS WITH MULTI-PHASE OSCILLATORS

(71) Applicant: ANALOG DEVICES, INC., Norwood, MA (US)

(72) Inventors: Roger Van Brunt, Santa Cruz, CA (US); Stefan Jones, Falls Church, VA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/270,751

(22) Filed: Sep. 20, 2016

(65) Prior Publication Data

US 2017/0093412 A1 Mar. 30, 2017

Related U.S. Application Data

(60) Provisional application No. 62/222,868, filed on Sep. 24, 2015.

(51) Int. Cl.
*H03L 7/06* (2006.01)
*H03L 7/197* (2006.01)
(Continued)

(52) U.S. Cl.
CPC ........... *H03L 7/1974* (2013.01); *H03L 7/091* (2013.01); *H03L 7/093* (2013.01); *H03L 7/099* (2013.01)

(58) Field of Classification Search
USPC .................................. 327/147–149, 156–158
See application file for complete search history.

(56) References Cited

U.S. PATENT DOCUMENTS 6,249,189 B1 6/2001 Wu et al.
6,556,089 B2 4/2003 Wood
(Continued)

FOREIGN PATENT DOCUMENTS

JP          2002/217723 A    8/2002
WO    WO 2004/107579 A2   12/2004
WO    WO 2006/133225 A2   12/2006

OTHER PUBLICATIONS

De Muer, B., Steyaert, M., "A 1.8 GHz CMOS ΔΣ Fractional-N Frequency Synthesizer," Design for High Spectral Purity and Monolithic Integration, 2003, ISBN 978-0-306-48001-0, Chapter 6, in 58 pages.
(Continued)

*Primary Examiner* — Adam Houston
(74) *Attorney, Agent, or Firm* — Knobbe Martens Olson & Bear LLP

(57) ABSTRACT

Apparatus and methods for fractional-N synthesizer phase-locked loops with multi-phase oscillators are provided. In certain configurations, a fractional-N PLL includes a time-to-digital converter (TDC), a digital loop filter, a multi-phase oscillator, and fractional division circuitry. The multi-phase oscillator includes multiple taps used to generate multiple clock signal phases that are provided to the fractional division circuitry to reduce the fractional-N PLL's quantization error. The fractional division circuitry includes a tap error correction circuit for compensating for errors in tap positions of the multi-phase oscillator. By including the tap error correction circuit, the phase noise and/or jitter performance of the fractional-N PLL can be enhanced.

20 Claims, 6 Drawing Sheets

(51) Int. Cl.
*H03L 7/091* (2006.01)
*H03L 7/093* (2006.01)
*H03L 7/099* (2006.01)

(56) References Cited

U.S. PATENT DOCUMENTS

| | | | |
|---|---|---|---|
| 7,236,060 B2 | 6/2007 | Wood | |
| 7,683,726 B2 | 3/2010 | Kim | |
| 7,978,012 B2* | 7/2011 | Wood | H03K 21/023 331/1 A |
| 8,791,733 B2* | 7/2014 | Tertinek | H03L 7/085 327/156 |
| 9,209,745 B2 | 12/2015 | Beccue | |
| 9,246,499 B2* | 1/2016 | Balachandran | H03L 7/099 |
| 9,473,069 B1 | 10/2016 | Beccue | |
| 9,722,539 B2* | 8/2017 | Hekmat | H03B 27/00 |
| 2003/0189464 A1* | 10/2003 | Drapkin | H03L 7/081 331/45 |
| 2004/0212410 A1* | 10/2004 | Ghazali | H03L 7/18 327/156 |
| 2006/0082417 A1* | 4/2006 | Neurauter | H03L 7/1974 331/16 |
| 2009/0072913 A1 | 3/2009 | Eikenbroek | |
| 2009/0215423 A1 | 8/2009 | Hwang et al. | |
| 2010/0117744 A1 | 5/2010 | Takinami et al. | |
| 2011/0050301 A1* | 3/2011 | Perrott | H03H 19/008 327/156 |
| 2011/0156773 A1 | 6/2011 | Beccue | |
| 2011/0267120 A1* | 11/2011 | Ravi | H03L 7/1978 327/159 |
| 2012/0013408 A1 | 1/2012 | Cortadella et al. | |
| 2012/0112841 A1 | 5/2012 | Hayashi | |
| 2012/0249198 A1 | 10/2012 | Sinha et al. | |
| 2013/0113536 A1* | 5/2013 | Sfikas | H03L 7/091 327/158 |
| 2013/0147531 A1* | 6/2013 | Lee | H03L 7/085 327/158 |
| 2013/0154750 A1 | 6/2013 | Martchovsky | |
| 2013/0257494 A1* | 10/2013 | Nikaeen | H03M 3/458 327/156 |
| 2013/0278303 A1* | 10/2013 | Chen | H03L 7/101 327/117 |
| 2014/0015615 A1* | 1/2014 | Hekmat | H03L 7/06 331/2 |
| 2014/0266341 A1* | 9/2014 | Jang | H03L 7/085 327/156 |
| 2014/0340131 A1* | 11/2014 | Rey | H03L 7/1075 327/156 |
| 2015/0145567 A1* | 5/2015 | Perrott | H03L 7/093 327/156 |
| 2015/0222287 A1 | 8/2015 | Tekin et al. | |
| 2015/0372690 A1* | 12/2015 | Tertinek | H03L 7/1976 327/156 |
| 2015/0381191 A1* | 12/2015 | Wu | H03L 7/0802 331/1 R |
| 2016/0087639 A1* | 3/2016 | Wicpalek | H03L 7/085 327/154 |
| 2017/0093412 A1* | 3/2017 | Van Brunt | H03L 7/091 |

OTHER PUBLICATIONS

Hajimiri et al, "Jitter and Phase Noise in Ring Oscillators," IEEE Journal of Solid-State Circuits, vol. 34, No. 6, Jun. 1999, in 15 pages.

Sun, L., Kwasniewski, TA., "A 1.25- GHz 0.35-μm Monolithic CMOS PLL Based on a Multiphase Ring Oscillator," IEEE Journal of Solid-State Circuits, vol. 36, No. 6, Jun. 2001, in 7 pages.

International Search Report and Written Opinion for International Application No. PCT/US2016/052799 dated Dec. 21, 2016 in 13 pages.

* cited by examiner

APPARATUS AND METHODS FOR FRACTIONAL-N PHASE-LOCKED LOOPS WITH MULTI-PHASE OSCILLATORS

CROSS-REFERENCE TO RELATED APPLICATIONS

The present application claims priority to U.S. Provisional Patent Application No. 62/222,868, filed Sep. 24, 2015, and titled "APPARATUS AND METHODS FOR FRACTIONAL-N PHASE LOCKED LOOPS," the entirety of which is hereby incorporated herein by reference.

FIELD OF THE DISCLOSURE

Embodiments of the invention relate to electronic systems, and more particularly, to fractional-N phase-locked loops.

BACKGROUND

Multi-phase oscillators can be used in a variety of applications, including, for example, telecommunications, optical networks, radar systems, and/or chip-to-chip communication. For instance, a multi-phase oscillator can be included in a frequency synthesizer to generate an output clock signal that has a controlled phase and frequency relationship relative to a reference clock signal.

SUMMARY OF THE DISCLOSURE

Apparatus and method for fractional-N phase-locked loops (PLLs) with multi-phase oscillators are provided herein. In certain configurations, a fractional-N PLL includes a time-to-digital converter (TDC), a digital loop filter, a multi-phase oscillator, and fractional division circuitry. The multi-phase oscillator includes multiple taps used to generate multiple clock signal phases that are provided to the fractional division circuitry to reduce the fractional-N PLL's quantization error. The fractional division circuitry includes a tap error correction circuit for compensating for errors in tap positions of the multi-phase oscillator. By including the tap error correction circuit, the phase noise and/or jitter performance of the fractional-N PLL can be enhanced.

In one aspect, a PLL having low jitter is provided. The PLL includes a TDC configured to generate a TDC output signal based on a reference clock signal and a feedback clock signal, a digital loop filter configured to process the TDC output signal to generate a digital frequency control signal, a multi-phase oscillator including a plurality of taps configured to provide a plurality of clock signal phases, and fractional division circuitry configured to receive the plurality of clock signal phases and to generate the feedback clock signal. A frequency of the multi-phase oscillator is controllable by the digital frequency control signal. Additionally, the fractional division circuitry includes a tap error correction circuit configured to compensate for a plurality of tap errors of the plurality of taps of the multi-phase oscillator.

In another aspect, a method of fractional frequency synthesis is provided. The method includes generating a TDC output signal by performing time-to-digital conversion based on a reference clock signal and a feedback clock signal, digitally filtering the TDC output signal to generate a digital frequency control signal, controlling a frequency of a multi-phase oscillator using the digital frequency control signal, generating a plurality of clock signal phases using a plurality of taps of the multi-phase oscillator, generating the feedback clock signal based on the plurality of clock signal phases, and compensating for a plurality of tap errors of the plurality of taps of the multi-phase oscillator.

In another aspect, a PLL having low jitter is provided. The PLL includes a TDC configured to generate a TDC output signal based on a reference clock signal and a feedback clock signal, a digital loop filter configured to process the TDC output signal to generate a digital frequency control signal, a multi-phase oscillator including a plurality of taps configured to provide a plurality of clock signal phases, and fractional division circuitry configured to receive the plurality of clock signal phases and to generate the feedback clock signal. A frequency of the multi-phase oscillator is controllable by the digital frequency control signal. Additionally, the fractional division circuitry includes means for compensating for a plurality of tap errors of the plurality of taps of the multi-phase oscillator.

In another aspect, a fractional-N PLL includes a time-to-digital converter (TDC), a digital loop filter, a multi-phase oscillator, and fractional division circuitry. The multi-phase oscillator includes a plurality of taps that generate a plurality of clock signal phases that are provided to the fractional division circuitry. The fractional division circuitry includes a tap error correction circuit that compensates for tap errors of the plurality of taps of the multi-phase oscillator. By including the tap error correction circuit, the phase noise and/or jitter performance of the fractional-N PLL can be enhanced.

In some embodiments, the multi-phase oscillator is a rotary traveling wave oscillator.

In certain embodiments, the tap error correction circuit determines tap errors of the multi-phase oscillator based on processing an output of the TDC.

According to a number of embodiments, the tap error correction circuit determines a running average of a tap error for each of the taps.

In some embodiments, the fractional division circuitry includes a fractional divider and a modulator that controls division operations of the fractional divider.

In various embodiments, the tap error correction circuit provides tap error correction based on adjusting a value of a multi-bit input signal to the modulator.

In certain embodiments, the modulator is a delta sigma modulator.

In another aspect, a method of fractional frequency synthesis is provided. The method includes generating a plurality of clock signal phases using a multi-phase oscillator of a fractional-N PLL, providing the plurality of clock signal phases to fractional division circuitry of the fractional-N PLL, and compensating for errors in tap positions of the multi-phase oscillator using a tap error correction circuit of the fractional-N PLL.

In some embodiments, the multi-phase oscillator is a rotary traveling wave oscillator.

In certain embodiments, the method includes determining tap errors of the multi-phase oscillator based on processing an output of a TDC of the fractional-N PLL.

According to a number of embodiments, compensating for errors in the tap positions includes determining a running average for each of the tap errors.

In various embodiments, compensating for errors in the tap positions includes adjusting a value of an input signal to a modulator of the fractional-N PLL.

DETAILED DESCRIPTION OF EMBODIMENTS

Figure 1:
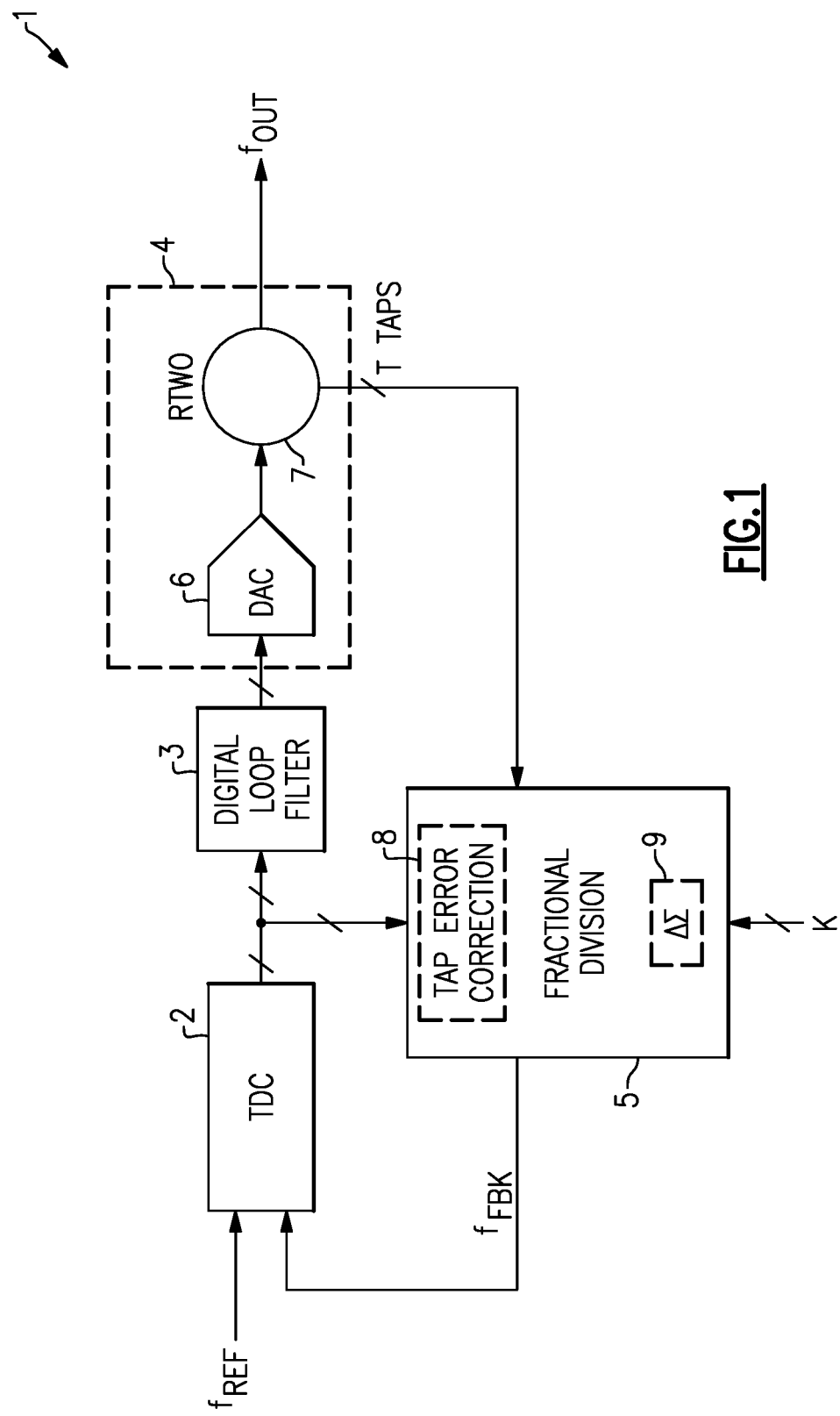
FIG. 1 is a schematic diagram of one embodiment of a fractional-N phase-locked loop (PLL).

The following detailed description of embodiments presents various descriptions of specific embodiments of the invention. In this description, reference is made to the drawings in which like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Phase-locked loops (PLLs) can be used in a variety of applications for generating an output clock signal having a controlled phase and frequency relationship to a reference clock signal. PLLs can be used in, for example, telecommunications systems and/or chip-to-chip communication.

An integer-N PLL can be implemented using an integer frequency divider inserted in the PLL's feedback loop. The integer-N PLL can be used to synthesize output frequencies in steps of a reference frequency by selecting an integer division value N of the frequency divider. For example, at steady state, the frequency of the integer-N PLL's output clock signal is about N times the reference clock signal's frequency.

To provide finer steps of output frequency adjustment, a fractional-N PLL can be used. In contrast to an integer-N PLL that uses integer division values, a fractional-N PLL permits fractional division values. At steady state, the frequency of the fractional-N PLL's output clock signal is about N+f times the reference clock signal's frequency, where N is the integer portion of the division value and f is the fractional portion of the division value.

A fractional-N PLL can be implemented using a time-to-digital converter (TDC), a digital loop filter, a controllable oscillator, and fractional division circuitry. The TDC compares a reference clock signal to a feedback clock signal generated by the fractional division circuitry. The output of the TDC is provided to the digital loop filter, which generates a filtered signal used to control a frequency of oscillation of the controllable oscillator. An output clock signal of the controllable oscillator is provided to the fractional division circuitry, which divides the output clock signal to generate the feedback clock signal for the TDC.

A fractional-N PLL can be implemented using a multi-phase oscillator, such as a rotary traveling wave oscillator (RTWO), that provides multiple clock signal phases to the fractional division circuitry. The multiple clock signal phases have the same frequency of oscillation, but different phases as one another. The fractional division circuitry operates using the multiple clock signal phases to reduce a quantization step size in the fractional-N PLL.

For example, a fractional-N PLL that provides fractional division based on a single clock signal phase can have a quantization noise jitter that is about $1/f_{OSC}$, where $f_{OSC}$ is a frequency of oscillator of the fractional-N PLL's oscillator. In contrast, using a multi-phase oscillator with T taps can ideally reduce the quantization noise jitter by a factor of about T relative to a fractional-N PLL operating using a single clock signal phase.

Although using multiple clock signal phases can reduce quantization step size, the clock signal phases can have a tap error, or uneven spacing between phases.

For instance, an RTWO is a type of multi-phase oscillator that includes a differential transmission line connected in a closed loop, an odd number of one or more cross-overs, and a plurality of regeneration circuits electrically connected along a path of the differential transmission line. Additionally, each of the cross-overs reverses the polarity of a wave propagating along the differential transmission line, and the regeneration circuits provide energy to the wave to compensate for the differential transmission line's losses.

In an RTWO, a traveling wave propagates along the differential transmission line. By tapping the differential transmission line at various positions, clock signals of different phases can be obtained. For instance, tapping an RTWO using T taps that are evenly spaced along the transmission line ideally generates clock signals that are spaced in phase by about 360/T degrees.

It can be difficult to implement an RTWO or other multi-phase oscillator with taps with high phase linearity, or even spacing between phases. For example, a layout of an RTWO's differential transmission line can impact the phase linearity of the RTWO's taps. For example, corners and/or curves can generate non-uniformities in the transmission line, which can degrade phase linearity. Moreover, the RTWO's cross-overs can also impact phase linearity, since the cross-overs can operate as a non-uniformity to the traveling wave that propagates along the differential transmission line. Moreover, the phase linearity of an RTWO can be constrained by design rules of a manufacturing process used to fabricate the RTWO. For instance, a manufacturing process can include design rules specifying transistor layouts to be orthogonal. Thus, even if the layout of the RTWO's differential transmission line were circular, the layout of transistors used in the RTWO's regeneration circuits and/or tap circuits may not match the curves of the RTWO. Accordingly, it can be difficult to implement an RTWO with taps of high phase linearity.

Apparatus and methods for fractional-N PLLs are provided herein. In certain configurations, a fractional-N PLL includes a TDC, a digital loop filter, a multi-phase oscillator, and fractional division circuitry. The multi-phase oscillator includes multiple taps used to generate multiple clock signal phases that are provided to the fractional division circuitry to reduce the fractional-N PLL's quantization error. The fractional division circuitry includes a tap error correction circuit for compensating for errors in tap positions of the multi-phase oscillator. By including the tap error correction circuit, the phase noise and/or jitter performance of the fractional-N PLL can be enhanced.

In certain implementations, the fractional division circuitry further includes a feedback divider and a delta sigma modulator that includes an accumulator. The delta sigma modulator shapes a quantization noise associated with the feedback divider. The feedback divider can divide a clock signal by N·f, where N in an integer and f is a fraction. The delta sigma modulator can receive a multi-bit input signal K, the accumulator width can have a value of D, and the fractional division rate f can be set by K/D. In certain implementations, the modulator output is an integer Y that is used to program the number of clocks in a reference cycle to N+Y.

By providing the fractional division circuitry with multiple clock signal phases from T taps, the number of clocks in a reference cycle can be N+I/T+Y/T, where I is an integer that varies with f. Thus, using multiple clock signal phases can improve jitter performance of the fractional-N PLL.

However, errors in tap spacing can generate inband noise that is not shaped out of band by the delta sigma modulator. Thus, tap errors can inhibit the fractional-N PLL from achieving full the benefit of operating the fractional division circuitry using multiple clock signal phases. By including the tap error correction circuit in the fractional division circuitry, the fractional-N PLL can reduce quantization error by a factor of 1/T, even when the T taps include tap errors.

In certain configurations, the TDC is used to digitize the phase error. Thus, the output of the TDC includes a tap position error associated with the multi-phase oscillator's taps. In one embodiment, the tap error correction circuit includes a table including tap errors for each tap. In certain configurations, a running average of a measured tap error is used to enhance accuracy. Thus, tap errors can be continuously monitored to provide robust tracking in the presence of variations in temperature and/or supply voltage.

The tap errors can be provided using feedback to an input of the delta sigma modulator, thereby reducing or eliminating inband noise associated with the tap errors.

FIG. 1 is a schematic diagram of one embodiment of a fractional-N PLL or synthesizer 1. The fractional-N PLL 1 includes a time-to-digital converter (TDC) 2, a digital loop filter 3, a multi-phase oscillator 4, and fractional division circuitry 5. The fractional-N PLL 1 receives a reference clock signal $f_{REF}$ and generates an output clock signal $f_{OUT}$.

In the illustrated configuration, the multi-phase oscillator 4 includes a digital-to-analog converter (DAC) 6 and a rotary travelling wave oscillator (RTWO) 7. The fractional division circuitry 5 includes a tap error correction circuit 8 and a delta sigma modulator 9, in this embodiment.

The TDC 2 compares the reference clock signal $f_{REF}$ to a feedback clock signal $f_{FBK}$ generated by the fractional division circuitry 5. The TDC 2 generates a multi-bit TDC output signal, which is provided to both the tap error correction circuit 8 and to the digital loop filter 3. The digital loop filter 3 digitally filters the multi-bit TDC output signal to generate a multi-bit filtered signal, which is provided to the DAC 6. The multi-bit filtered signal can also be referred to herein as a digital frequency control signal. The DAC 6 converts the multi-bit filtered signal into an analog oscillator control signal, which is used to control a frequency of oscillation of the RTWO 7.

Although the illustrated embodiment includes the DAC 6, in certain implementations the DAC 6 can be omitted. For example, an RTWO or other oscillator can be controlled using digital signals. For instance, an RTWO can include tuning capacitors distributed around the RTWO's differential transmission line, and the tuning capacitors can be digitally selected or controlled using digital logic circuitry, such as decoders.

In one embodiment, the multi-bit TDC output signal has between about 6 bits and about 8 bits, and the multi-bit filtered signal has between about 10 bits and about 12 bits. However, other numbers of bits can be used based on application and/or implementation.

The RTWO 7 includes T taps used to generate multiple clock signal phases, where T is an integer greater than 1. In certain implementations, T is selected to be at least 10. The multiple clock signal phases have the same frequency $f_{RTWO}$, but different phases from one another The multiple clock signal phases are provided as an input to the fractional division circuitry 5, which processes the multiple clock signal phases to generate the feedback clock signal $f_{FBK}$, which can be fractionally divided relative to the RTWO's frequency $f_{RTWO}$. The RTWO 7 also generates an output clock signal $f_{OUT}$, which serves as the output clock signal to the fractional-N PLL 1.

In the illustrated configuration, the multi-phase oscillator 4 is implemented using an RTWO. An RTWO is a type of electronic oscillator that includes a differential transmission line connected in a closed loop, an odd number of one or more cross-overs, and a plurality of regeneration circuits electrically connected along a path of the differential transmission line. Additionally, each of the cross-overs reverses the polarity of a wave propagating along the differential transmission line, and the regeneration circuits provide energy to the wave to compensate for the differential transmission line's losses. Additional details of RTWOs can be as described in commonly-owned U.S. Pat. No. 6,556,089, issued Apr. 29, 2003, and titled "ELECTRONIC CIRCUITRY," which is hereby incorporated by reference in its entirety herein. As persons having ordinary skill in the art will appreciate, clock signal phase can represent a fraction of a complete clock signal cycle elapsed as measured from a specified reference point.

In an RTWO, a traveling wave propagates along the differential transmission line. By tapping the differential transmission line at various positions, clock signals of different phases can be obtained. In one example, a tap amplifier, such as an inverter, can include an input electrically connected to a particular position of the differential transmission line to obtain a clock signal having a desired phase.

Although FIG. 1 illustrates a configuration using an RTWO, other configurations of multi-phase oscillators can be used. In another embodiment an inductor-capacitor (LC) tank is used. In yet another embodiment, a ring oscillator is used. Although a ring oscillator can provide multiple clock signal phase, a ring oscillator can have relatively high phase noise. Furthermore, a tap spacing of the ring oscillator can be limited by gate delays of the ring oscillator's inverter circuits. In contrast, an RTWO has better phase noise performance and can generate different clock signal phases based on tapping a differential transmission line at various positions along the line. Thus, tap spacing of the RTWO can advantageously be based on spacing on the transmission line rather than gate delays.

The illustrated fractional-N PLL 1 uses the RTWO 7 to provide multiple clock signal phases associate with T taps to the fractional division circuitry 5. Thus, the fractional division circuitry 5 generates the feedback clock signal $f_{FBK}$ using the multiple clock signal phases generated by the RTWO 7. By implementing the fractional-N PLL 1 in this manner, a quantization step size of the fractional-N PLL 1 can be reduced.

Although using multiple clock signal phases can reduce quantization step size, the clock signal phases can have a tap error, or uneven spacing between phases. For instance, tapping an RTWO using T taps that are evenly spaced along the transmission line ideally generates clock signals that are spaced in phase by about 360/T degrees. However, it can be difficult to implement an RTWO with high phase linearity, or even spacing between phases. For example, a layout of an RTWO's differential transmission line can impact the phase linearity of the RTWO's taps. For example, corners and/or curves can generate non-uniformities in the transmission line, which can degrade phase linearity. Moreover, the RTWO's cross-overs can also impact phase linearity, since the cross-overs can operate as a non-uniformity to the traveling wave that propagates along the differential transmission line.

Furthermore, the phase linearity of an RTWO can be constrained by design rules of a manufacturing process used to fabricate the RTWO. For instance, a manufacturing process can include design rules specifying transistor layouts to be orthogonal. Thus, even if the layout of the RTWO's differential transmission line were circular, the layout of transistors used in the RTWO's regeneration circuits and/or tap circuits may not match the curves of the RTWO. Accordingly, it can be difficult to implement an RTWO with taps of high phase linearity.

In the illustrated configuration, the multi-bit TDC output includes a tap position error associated with the tap errors of the T taps. The illustrated configuration advantageously includes the tap error correction circuit 8, which processes the multi-bit TDC output from the TDC 2 to determine the tap errors. The tap errors can be provided using feedback to an input of the delta sigma modulator 9, thereby reducing or eliminating inband noise associated with tap errors. In one embodiment, a multi-bit modulator input K is adjusted based on the tap errors. Thus, the delta sigma modulator 9 can operate using an adjusted modulator input signal that is compensated for the multi-phase oscillator's tap errors.

By including the tap error correction circuit 8 in the fractional division circuitry 5, the fractional-N PLL 1 can have a quantization error that is reduced by a factor of T, even when the taps include tap errors.

In certain configurations, the tap error correction circuit 8 processes the multi-bit TDC output to generate a running average of the tap errors. Configuring the tap error correction circuit 8 in this manner allows tap error change to be continuously monitored to provide robust tracking in the presence of variations in temperature and/or supply voltage. The tap error correction circuit 8 can include memory or state elements that store the tap errors. In one embodiment, the tap error correction circuit 8 includes a table of tap errors associated with each of the T taps.

Additional details of the fractional-N PLL 1 can be similar to those described earlier.

Figure 2:
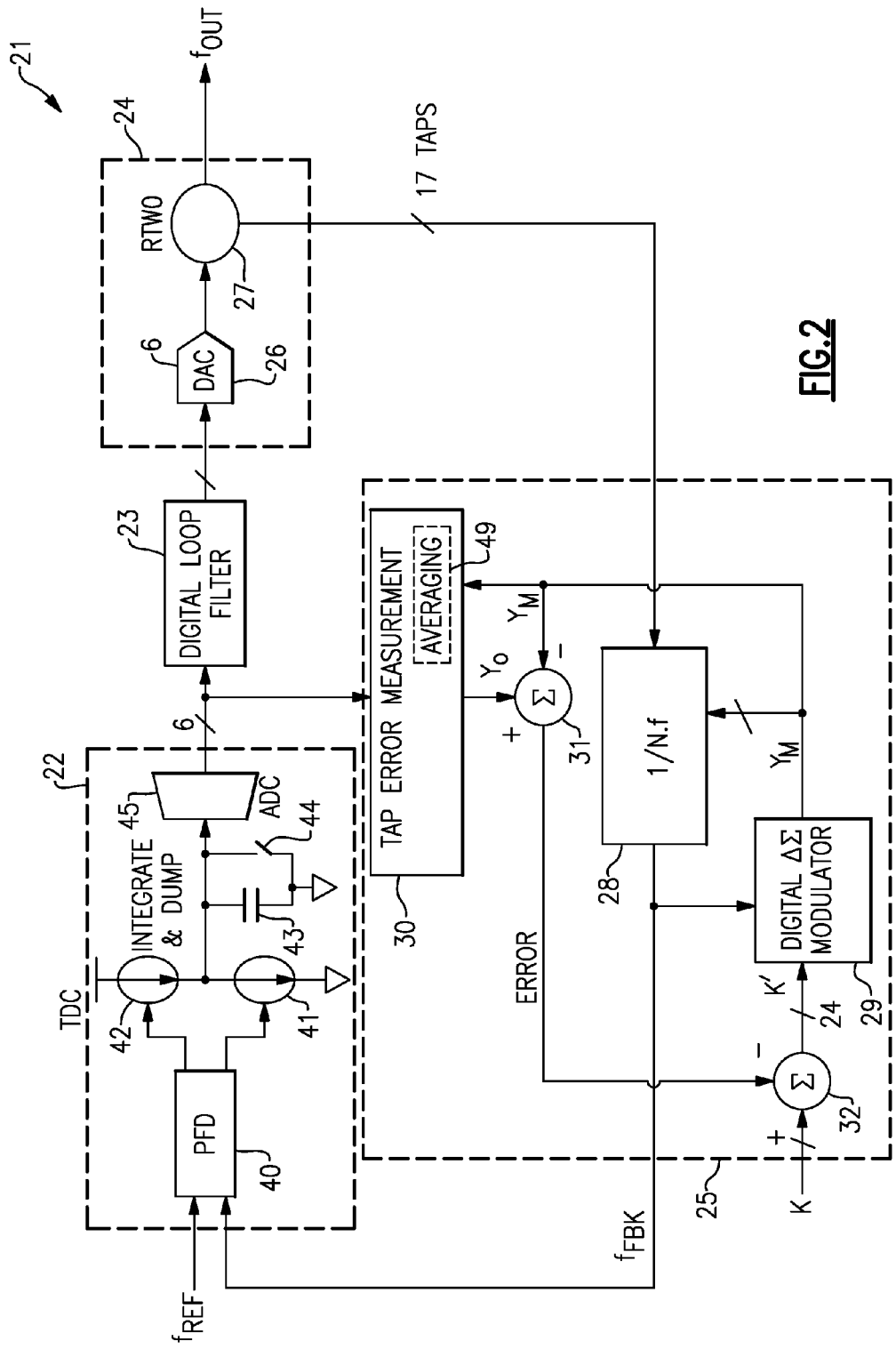
FIG. 2 is a schematic diagram of another embodiment of a fractional-N PLL.

FIG. 2 is a schematic diagram of another embodiment of a fractional-N PLL 21. The fractional-N PLL 21 includes a TDC 22, a digital loop filter 23, a multi-phase oscillator 24, and fractional division circuitry 25. The fractional-N PLL 21 receives a reference clock signal $f_{REF}$ and generates an output clock signal $f_{OUT}$.

In the illustrated configuration, the multi-phase oscillator 24 includes a DAC 26 and an RTWO 27. However, other configurations of multi-phase oscillators are possible. The illustrated RTWO 27 includes 17 taps. However, an RTWO or other multi-phase oscillator can include more or fewer taps.

The illustrated TDC 22 includes a phase frequency detector (PFD) 40, a down current source 41, an up current source 42, an integration capacitor 43, a dump switch 44, and an analog-to-digital converter (ADC) 45. As shown in FIG. 2, the TDC 22 is used to generate a multi-bit TDC output signal corresponding to a digital representation of a difference in time between edges of the reference clock signal $f_{REF}$ and the feedback clock signal $f_{FBK}$. Although FIG. 2 illustrates one configuration of a TDC that can be used in a fractional-N PLL, a TDC can be implemented in a wide variety of ways.

In one example, the multi-bit TDC output signal is 6 bits. However, other implementations are possible.

The fractional division circuitry 25 includes a fractional divider 28, a digital delta sigma modulator 29, and a tap error correction circuit that includes tap error measurement circuitry 30, a first subtractor 31, and a second subtractor 32.

The fractional divider 28 receives multiple clock signal phases (17 in this example, but more generally Ntaps) from the RTWO 27. The multiple clock signal phases having the same oscillation frequency $f_{RTWO}$, but different phases. The fractional divider 28 generates the feedback clock signal $f_{FBK}$ based on dividing $f_{RTWO}$ by N·f, where N in an integer and f is a fraction. As shown in FIG. 2, the digital delta sigma modulator 29 generates a modulator output signal $Y_M$ that controls division operations of the fractional divider 28. In certain implementations, the digital delta sigma modulator 29 is implemented as a MASH modulator. In the illustrated example, the modulator output signal $Y_M$ is in the range of 1 to 4 bits. However, other implementations are possible.

The tap error measurement circuitry 30 receives and processes a multi-bit TDC output signal generated by the TDC 22. The multi-bit TDC output signal includes error components associated with the RTWO's taps. The tap error measurement circuitry 30 detects the tap errors and, in the illustrated embodiment, determines a running average for each of the tap errors using averaging circuitry 49. The tap error measurement circuitry 30 generates a tap error correction signal $Y_O$. Although FIG. 2 illustrates a configuration in which tap errors are measured and averaged, other implementations are possible. For example, the tap error measurement circuitry 30 can process the TDC output signal in other ways, including, but not limited, using other types of statistical processing besides averaging.

The tap error measurement circuitry 30 processes the multi-bit TDC output signal to determine error measurements for each of the Ntaps (17 in this example) of the multi-phase oscillator 24. The tap error measurement circuitry 30 performs suitable calculations to convert the multi-bit TDC output signal to a measurement of an RTWO tap position associated with the current tap that is selected by the modulator 29. In certain implementations, the tap error measurement circuitry 30 includes a table of measurement errors for each tap, and the measurement errors for a particular tap can be averaged or otherwise processed over time to enhance measurement accuracy. After a suitable number of reference clock cycles (for instance, about 35,000 or more), the table can be used to compensate for tap errors by providing corrections to the modulator 29. In certain implementations, a new table is started after a certain number of reference cycles. In other implementations, a table is continuously updated via a running average. The tap error measurement circuitry 30 can process the multi-bit TDC output signal to detect the tap errors in a wide variety of ways.

The first subtractor 31 generates an error signal based on a difference between the tap error correction signal $Y_O$ and the modulator output signal $Y_M$. The fractional division circuitry 25 receives a modulator input signal K. The second subtractor 32 generates an adjusted modulator input signal K' based on a difference between the modulator input signal K and the error signal. The adjusted modulator input signal K' serves as an input to the digital delta sigma modulator 29. In the illustrated example, the adjusted modulator input signal K' is 24 bits. However, other implementations are possible.

By including a tap error correction circuit in the fractional division circuitry 25, the quantization error of the fractional-N PLL 21 can be reduced, even in the presence of tap errors of the RTWO 27.

In one embodiment, the tap error measurement circuitry 30 keeps track of the tap position based on summing the modulator output signal $Y_M$. In certain implementations, at time zero the tap positioned is assumed 1, and the tap positioned is moved based on the number of reference clock cycles and the modulator output signal $Y_M$. For example, if the modulator output signal $Y_M$ is 4, then after a passage of 1 reference clock the tap position can correspond to 5. Additionally, the multi-bit TDC output signal can correspond to a measure of the phase error with respect to the reference clock signal $f_{REF}$, and can travel f*Ntaps in 1 reference clock cycle. Since the multi-bit TDC output signal corresponds to the phase error at the reference clock frequency, the tap error measurement circuitry 30 can be configured to scale the multi-bit TDC output signal by Ntaps*(N·f)/(2π). Additionally, subtracting the scaled phase error from f*Ntaps yields a measured position of the current tap with respect to the reference tap, for instance tap 1. Furthermore, the error of the current tap corresponds to measured tap position minus the expected tap position. Additionally, the tap error measurement circuitry 30 can compensate for the taps being arranged in a ring by adjusting appropriate calculations by a modulo of Ntaps. The tap errors can be stored, for instance, in a table, and the errors of a particular tap can be averaged or otherwise statistically processed over time to enhance measurement accuracy.

Additional details of the fractional-N PLL 21 can be as described earlier.

Figure 3:
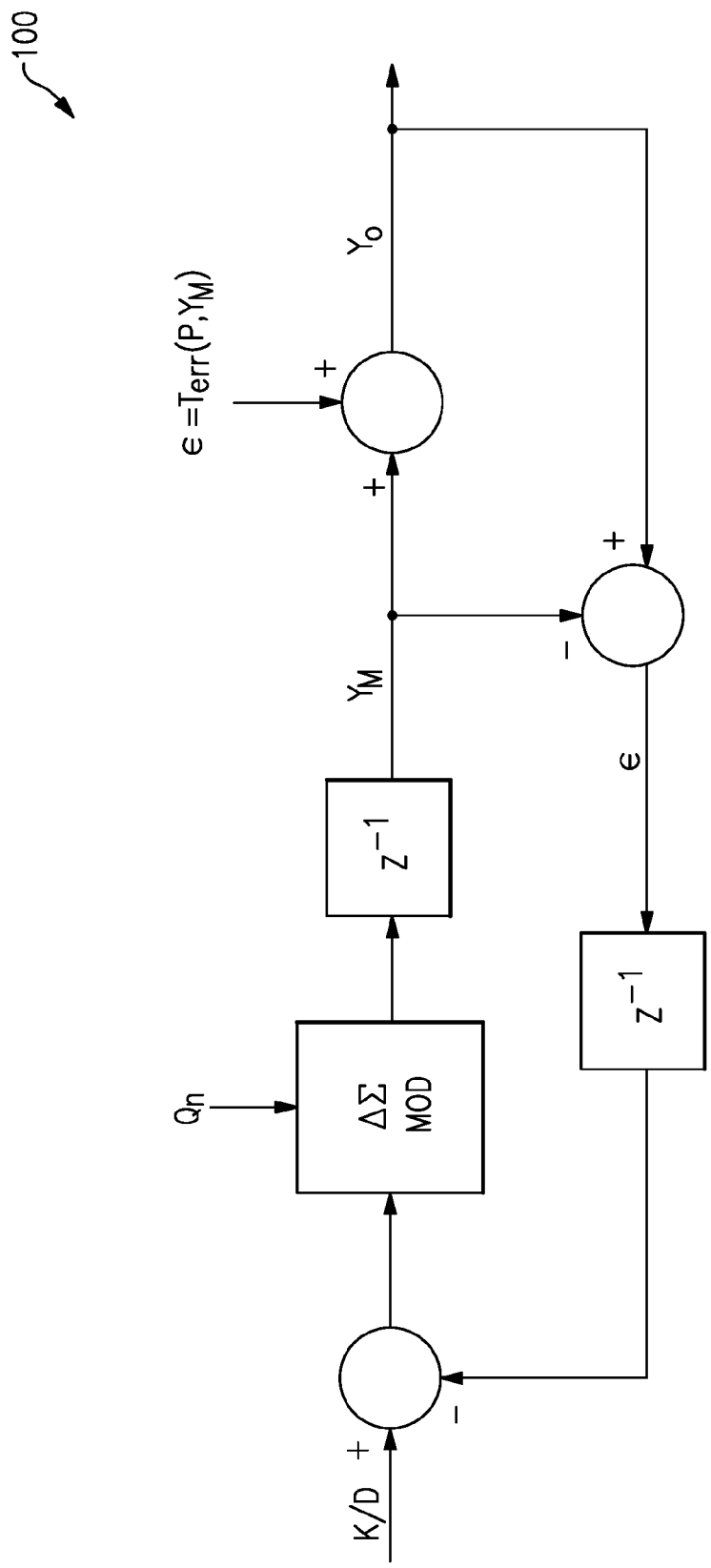
FIG. 3 is a block diagram of one embodiment of a tap error correction loop including mathematical annotations in the z-domain.

FIG. 3 is a block diagram of one embodiment of a tap error correction loop 100 including mathematical annotations in the z-domain.

Absent correction, errors in RTWO tap positions can cause the inband modulator noise to increase. The tap error correction loop 100 illustrates one embodiment of an error correction scheme for reducing such inband noise.

In the illustrated example, $f_x$=K/D. Additionally, $Y_M$ is the output of a delta sigma modulator and is a distance the tap selection position should move. For a third order MASH modulator, $Y_M$ can be an integer from −3 to 4. Additionally, $\epsilon = T_{err}$ is the error in the distance, and $T_{err}$ is a function of tap position P and the input distance $Y_M$. Furthermore, $Y_o$ is the actual distance moved, and $Q_n$ is the modulator quantization error. Additionally, $z^{-1}$ is the reference clock's delay in the z-domain.

Ignoring the K/D input, $Y_M = -z^{-2}$ stf $\epsilon + z^{-1}$ ntf $Q_n$, where stf is the signal transfer function and can be equal to 1, and ntf is the noise transfer function and can be equal to $(1-z^{-1})^3$ for a third-order MASH modulator.

Additionally, $Y_o = -z^{-2}$ stf $\epsilon + z^{-1}$ ntf $Q_n + \epsilon$.

By substituting $\epsilon$ into the equation for $Y_o$, we obtain $Y_o = z^{-1}$ ntf $Q_n + (1-\text{stf } z^{-2})*\epsilon$. This can be simplified to $Y_o = z^{-1}$ ntf $Q_n + (1-z^{-2})*\epsilon$.

The first term of the equation above associated with ntf can be relatively small and inside the PLL's bandwidth. Thus, in certain implementations, inband noise can be approximated as $(1-z^{-2})*\epsilon$. Thus, a $1-z^{-2}$ term can be introduced by the correction in this example and reduces the inband noise.

Although one example of a tap error correction loop 100 has been illustrated and described in FIG. 3, the teachings herein are applicable to a wide variety of tap error correction loops. Accordingly, other configurations are possible.

Table 1 below shows one illustrative example of tap errors for a 17 tap multi-phase oscillator, where tap(1) is the reference tap in this example.

TABLE 1

| Taps |
|---|
| tap(1) = 1 |
| tap(2) = 1.9557 |
| tap(3) = 3.1007 |
| tap(4) = 4.1077 |
| tap(5) = 4.9385 |
| tap(6) = 6.0766 |
| tap(7) = 6.8356 |
| tap(8) = 7.8743 |
| tap(9) = 8.8935 |
| tap(10) = 9.8922 |
| tap(11) = 11.0138 |
| tap(12) = 11.9143 |
| tap(13) = 12.8923 |
| tap(14) = 13.8372 |
| tap(15) = 15.0567 |
| tap(16) = 15.9662 |
| tap(17) = 17.1122 |

Table 2 below shows illustrative values of tap position, $Y_M$, $Y_o$, and $\epsilon$ for an example in which a division fraction is 8.33/17. The table below includes a sequence showing the taps selected as *$Y_M$ changes, where *$Y_M$=8+Mash Out. As shown in Table 2, starting at tap position 11 and $Y_M$=8 the new tap position is 11+8−17=2. The actual distance traveled is 1.9557−11.0138+17=7.9420=$Y_o$, and the error $\epsilon$=−0.058.

TABLE 2

| | Tap Position | | | | | | | | | |
|---|---|---|---|---|---|---|---|---|---|---|
| | 11 | 2 | 11 | 1 | 12 | 2 | 12 | 2 | 11 | 4 | 11 |
| $Y_M$ | 8 | 9 | 7 | 11 | 7 | 10 | 7 | 9 | 10 | 7 | 9 |
| $Y_o$ | 7.9420 | 9.0580 | 6.9862 | 10.9143 | 7.0414 | 9.9586 | 7.0414 | 9.0580 | 10.0939 | 6.9061 | 9.0869 |
| $\epsilon$ | −0.058 | 0.058 | −0.0138 | −0.0857 | 0.0414 | −0.0414 | 0.0414 | 0.058 | 0.0939 | −0.0939 | 0.0869 |

In one embodiment, a tap error is calculated based on an output of an ADC of a TDC (vout_adc(j) is the j th output of the adc where j starts at 1). Additionally, $\phi_{e\_dig}(j)$= (vout_adc(j)+1)/$G_{fe\_dig}$, where vout_adc has a min value of 100000 and max value of 011110, and $G_{fe\_dig}$ is the conversion gain from phase to bits. In one example, $G_{fe\_dig}$=31/ (2*$T_{vco}$/$N_{taps}$*2π$f_{ref}$), where $T_{vco}$ is the period of the RTWO and $N_{taps}$ is the number of rtwo taps. Furthermore, Position_m(j)=1+((j−1)f−($\phi_{e\_dig}$(j)/2π)*(N·f)*$N_{taps}$, where N·f is the feedback divider with f corresponding to the fractional part. Additionally, Position_m(j)=mod(Position_m(j),$N_{taps}$), and if Position_m(j)<0.5, then Position_m(j)=$N_{taps}$+Position_m(j). Position_m(j) is the measured tap position in this embodiment.

Although one example of tap errors has been shown and one example of tap error correction described, the teachings herein are applicable to a wide variety of tap error correction loops. Accordingly, other configurations are possible.

Figure 4:
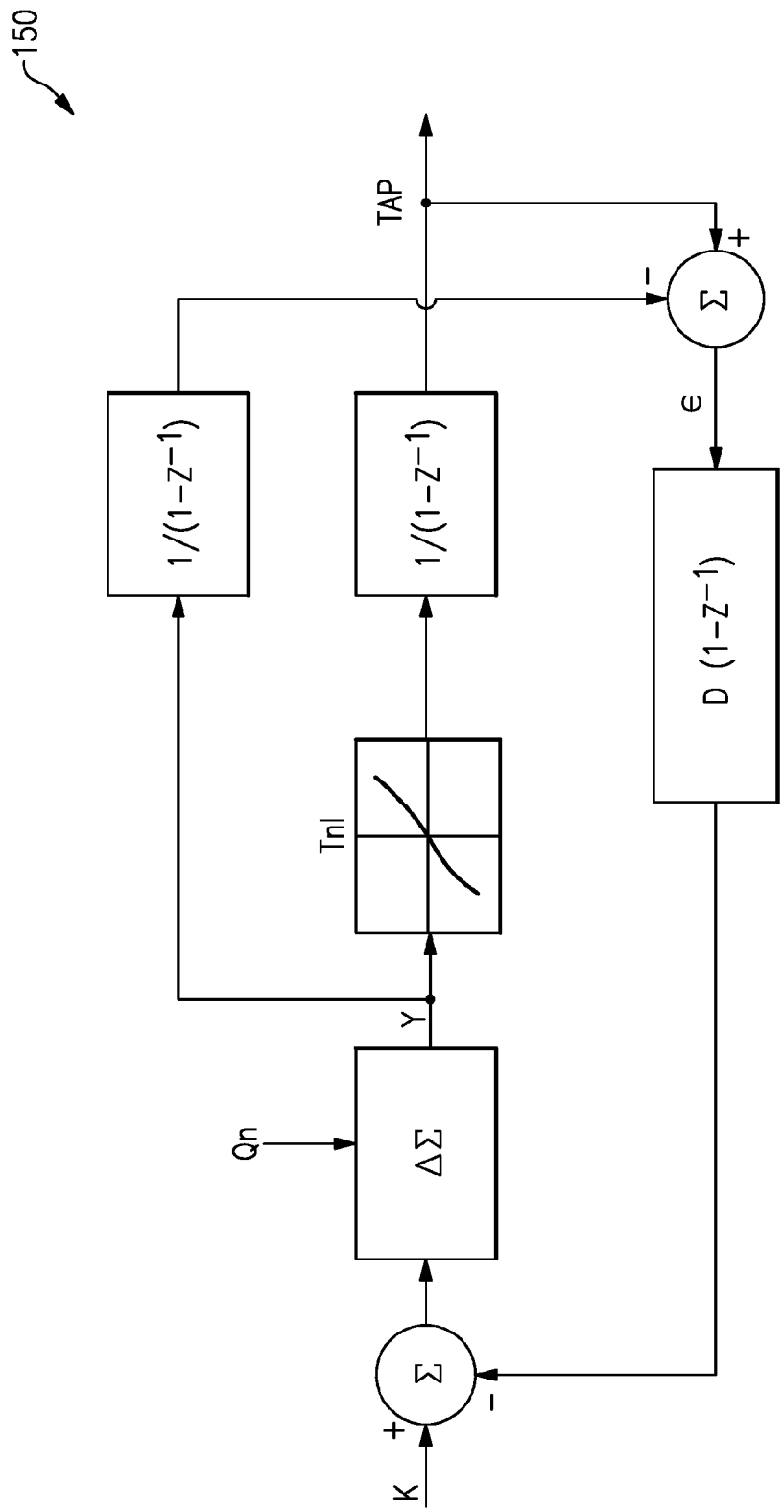
FIG. 4 is a block diagram of another embodiment of a tap error correction loop including mathematical annotations in the z-domain.

FIG. 4 is a block diagram of another embodiment of a tap error correction loop 150 including mathematical annotations in the z-domain.

In the illustrated example, K is a 24 bit digital input to a delta sigma modulator. Additionally, M is an order of the delta sigma modulator, which is of MASH type and a cascade of first order modulators in this example (M=2, 3, 4). Furthermore, D is a width of the accumulators in the delta sigma (24 bits in this example). Additionally, Qn is white quantization noise. Furthermore, Y is the output of the modulator (for instance, Y=−3, −2, −1, 0, 1, 2, 3, 4 when M=3). Y can represent the number of phase taps to move from the current tap position. Additionally, Tnl can represent a non-linearity due to error in the phase taps. Each tap (0:n−1) measured with respect to tap(0) can have an error. For instance, tap(2)=2+$\epsilon_2$. Furthermore, ntf is the noise transfer function of the delta sigma modulator. For a third order modulator, ntf can be represented in the z-domain by $(1-Z^{-1})^3$. Additionally, stf is the signal transfer function of the delta sigma modulator, which can be $Z^{-3}$ for a third order modulator.

In this example, Y=−stf D $(1-Z^{-1})\epsilon$/D+ntf Qn. The first term in this equation is the error correction term and the second term is the shaped quantization noise. Assuming that stf D $(1-Z^{-1})\epsilon$ is relatively small and that Tnl*stf $(1-Z^{-1})\epsilon$ can be approximated as stf $(1-Z^{-1})\epsilon$, then the tap output can be given by Tap=−stf $\epsilon$+ntf Qn Tnl/$(1-Z^{-1})$. The first term of this equation is the error correction at the output and the second term is the shaped noise as it passes through the non-linearity Tnl. This non-linearity can result in the shaped out of band quantization noise (ntf Qn) folding to low frequency and residing inband of the synthesizer's transfer function.

In the illustrated example, the measured tap error is compared to the ideal upper reference path: $\epsilon$=ntf Qn Tnl/$(1-Z^{-1})$−ntf Qn/$(1-Z^{-1})$. Substituting $\epsilon$ into the equation for tap output yields Tap=−stf ntf Qn Tnl/$(1-Z^{-1})$+stf ntf Qn/$(1-Z^{-1})$+ntf Qn Tnl/$(1-Z^{-1})$. This can be rearranged to yield Tap=(1−stf) ntf Qn Tnl/$(1-Z^{-1})$+stf ntf Qn/$(1-Z^{-1})$.

Additionally, we can define $\alpha$ to be $1-stf=1-Z^{-3}$, which can be approximated as 3 sT=3*2*$\pi$*f/$f_{REF}$. At $f_{REF}$=50 MHz and f=1 Mhz (the bandwidth of the synthesizer, in this example), this can be less than 0.36 for inband frequencies.

Thus, the tap can be approximated as stf ntf Qn/$(1-Z^{-1})$+$\alpha$ ntf Qn Tnl/$(1-Z^{-1})$. In this equation for the corrected tap output, the first term is the out of band shaped quantization noise, and the second term is the shaped quantization noise folded inband and attenuated by the correction. For a third order MASH modulator, a 50 MHz reference clock signal, and a synthesizer bandwidth of 1 MHz, the attenuation of the folded noise is more than 9 dB. With no correction, the first term would be zero and $\alpha$=1 (no attenuation of folded noise).

Although one example of a tap error correction loop 150 has been illustrated and described in FIG. 4, the teachings herein are applicable to a wide variety of tap error correction loops. Accordingly, other configurations are possible.

Figure 5A:
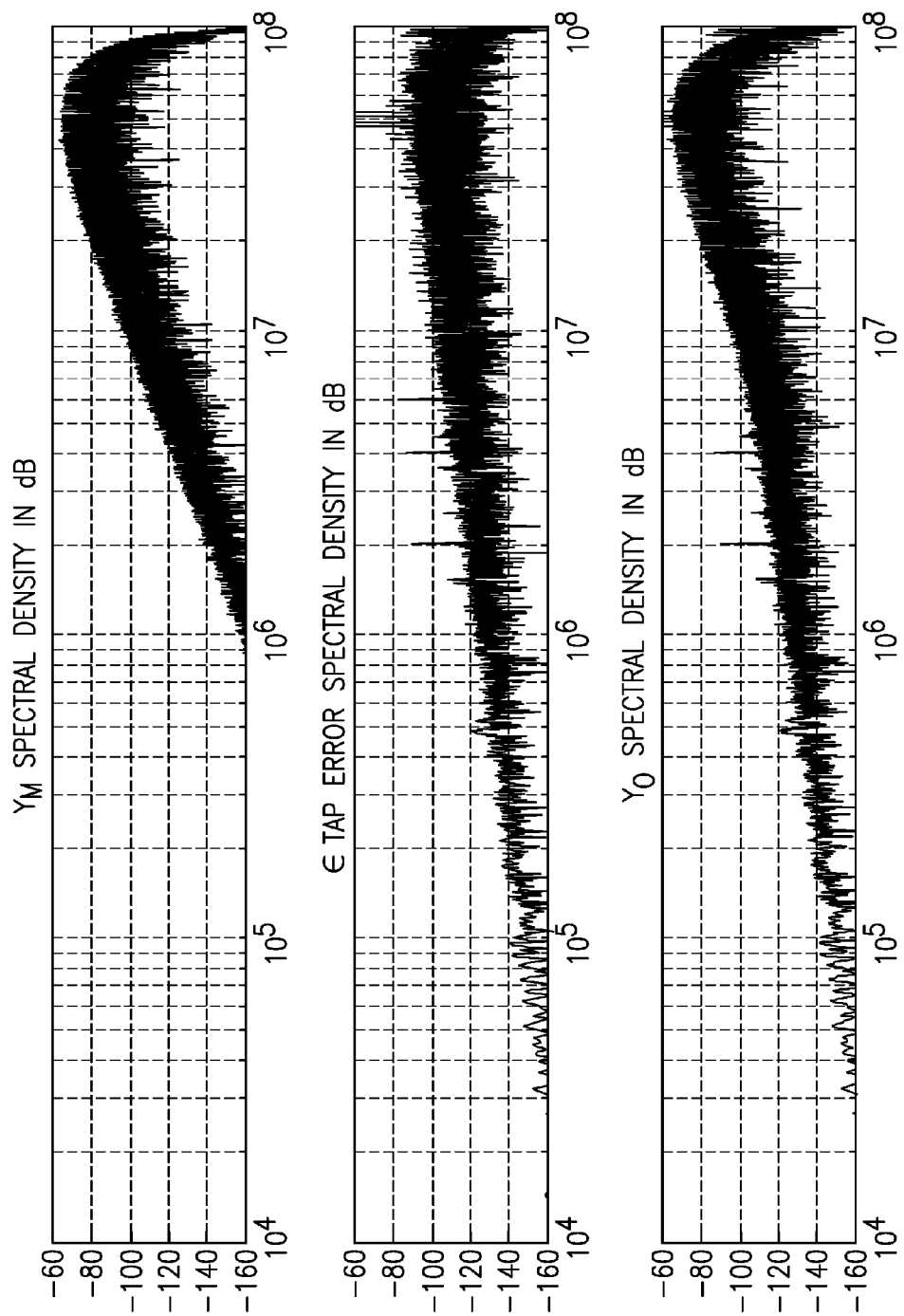
FIGS. 5A and 5B are graphs of frequency versus spectral density for two examples of fractional-N PLLs.
Figure 5B:
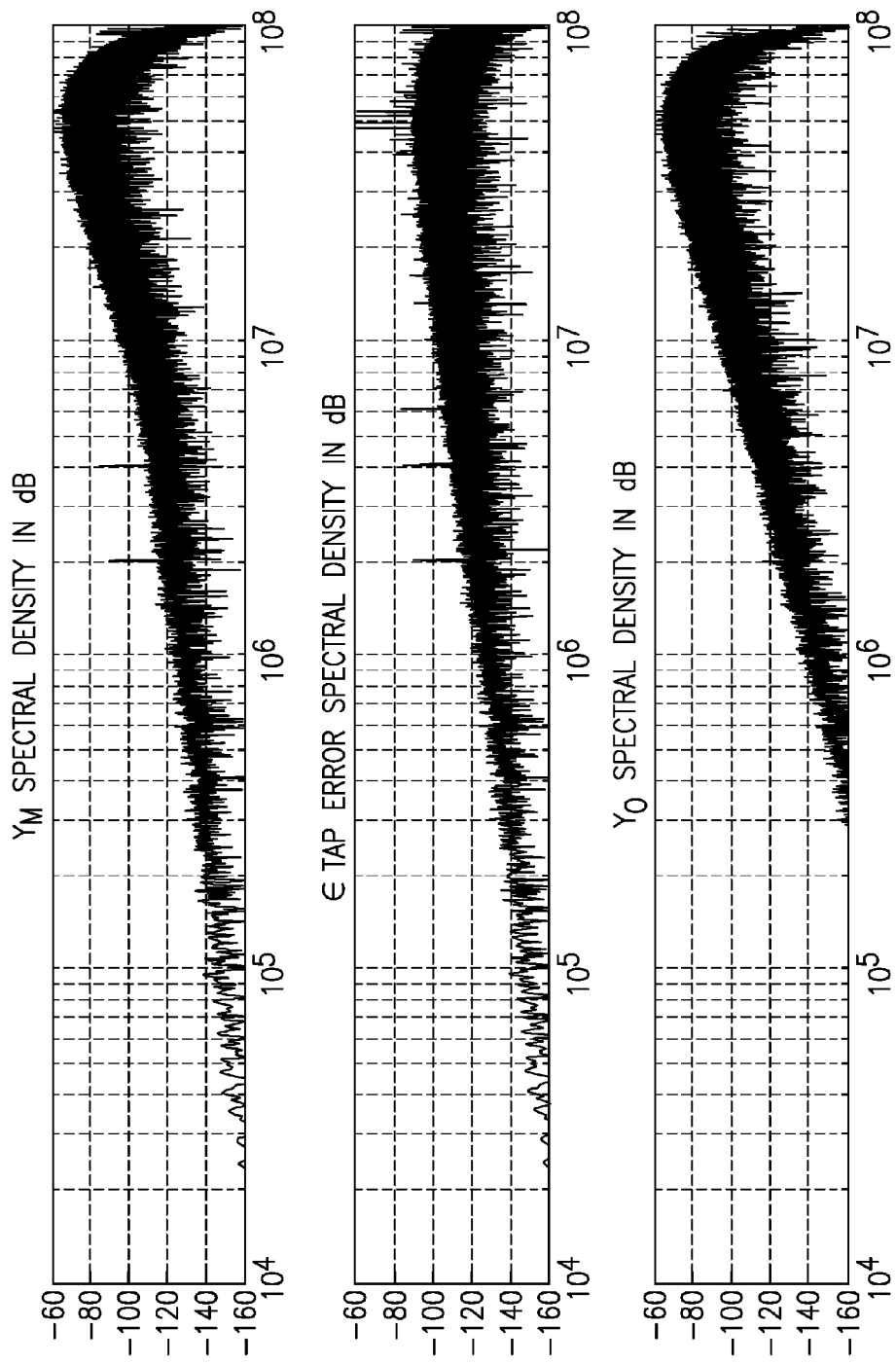

FIGS. 5A and 5B are graphs of frequency versus spectral density for two examples of fractional-N PLLs. FIG. 5A illustrates one example of $Y_M$, $\epsilon$, and $Y_o$ without a tap error correction circuit. Additionally, FIG. 5B illustrates one example of $Y_M$, $\epsilon$, and $Y_o$ for a fractional-N PLL with a tap error correction circuit. As shown in FIGS. 5A and 5B, a tap error correction circuit improves spectral density characteristics of a fractional-N PLL.

Although FIGS. 5A and 5B illustrate two examples of graphs of frequency versus spectral density, other results are possible. For example, frequency versus spectral density can vary based on a wide variety of factors, including, for example, application and/or implementation.

APPLICATIONS

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multi-functional peripheral device, etc. Further, the electronic device can include unfinished products, including those for industrial, medical and automotive applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A phase-locked loop (PLL) having low jitter, the PLL comprising:
    a time-to-digital converter (TDC) configured to generate a TDC output signal based on a reference clock signal and a feedback clock signal;
    a digital loop filter configured to process the TDC output signal to generate a digital frequency control signal;
    a multi-phase oscillator comprising a plurality of taps configured to provide a plurality of clock signal phases, wherein a frequency of the multi-phase oscillator is controllable by the digital frequency control signal; and
    fractional division circuitry configured to receive the plurality of clock signal phases and to generate the feedback clock signal, wherein the fractional division circuitry comprises a tap error correction circuit configured to compensate for a plurality of tap errors of the plurality of taps of the multi-phase oscillator.

2. The PLL of claim 1, wherein the tap error correction circuit is configured to detect the tap errors based on processing the TDC output signal.

3. The PLL of claim 2, wherein the tap error correction circuit is further configured to calculate a running average for at least a portion of the tap errors.

4. The PLL of claim 1, wherein the fractional division circuitry comprises a fractional divider and a modulator configured to control a division operation of the fractional divider.

5. The PLL of claim 4, wherein the tap error correction circuit is configured to compensate for the tap errors based on adjusting a value of an input signal to the modulator.

6. The PLL of claim 4, wherein the tap error correction circuit comprises a tap error measurement circuit configured to receive the TDC output signal and to generate a tap error correction signal.

7. The PLL of claim 6, wherein the tap error correction circuit is configured to generate an error signal based on a difference between the tap error correction signal and an output signal of the modulator.

8. The PLL of claim 7, wherein the tap error correction circuit is configured to adjust a value of an input signal to the modulator based on the error signal.

9. The PLL of claim 1, wherein the multi-phase oscillator comprises a rotary traveling wave oscillator (RTWO).

10. The PLL of claim 1, wherein the plurality of taps comprises at least 10 taps.

11. A method of fractional frequency synthesis, the method comprising:
 generating a time-to-digital converter (TDC) output signal by performing time-to-digital conversion based on a reference clock signal and a feedback clock signal;
 digitally filtering the TDC output signal to generate a digital frequency control signal;
 controlling a frequency of a multi-phase oscillator using the digital frequency control signal;
 generating a plurality of clock signal phases using a plurality of taps of the multi-phase oscillator;
 generating the feedback clock signal based on the plurality of clock signal phases; and
 compensating for a plurality of tap errors of the plurality of taps of the multi-phase oscillator.

12. The method of claim 11, wherein compensating for the tap errors comprises detecting the tap errors based on processing the TDC output signal.

13. The method of claim 11, further comprising calculating a running average of at least a portion of the tap errors.

14. The method of claim 11, wherein compensating for the tap errors comprises adjusting a value of an input signal to a modulator.

15. The method of claim 14, further comprising generating a tap error correction signal based on processing the TDC output signal to detect the tap errors.

16. The method of claim 14, further comprising generating an error signal based on a difference between the tap error correction signal and an output signal of the modulator.

17. The method of claim 16, further comprising adjusting the value of the input signal to the modulator based on the error signal.

18. The method of claim 11, further comprising generating the plurality of clock signal phases using a rotary traveling wave oscillator (RTWO).

19. A phase-locked loop (PLL) having low jitter, the PLL comprising:
 a time-to-digital converter (TDC) configured to generate a TDC output signal based on a reference clock signal and a feedback clock signal;
 a digital loop filter configured to process the TDC output signal to generate a digital frequency control signal;
 a multi-phase oscillator comprising a plurality of taps configured to provide a plurality of clock signal phases, wherein a frequency of the multi-phase oscillator is controllable by the digital frequency control signal; and
 fractional division circuitry configured to receive the plurality of clock signal phases and to generate the feedback clock signal, wherein the fractional division circuitry comprises means for compensating for a plurality of tap errors of the plurality of taps of the multi-phase oscillator.

20. The PLL of claim 19, wherein the multi-phase oscillator comprises a rotary traveling wave oscillator (RTWO).

* * * * *